(12) United States Patent
Patti et al.

(10) Patent No.: US 7,750,488 B2
(45) Date of Patent: Jul. 6, 2010

(54) METHOD FOR BONDING WAFERS TO PRODUCE STACKED INTEGRATED CIRCUITS

(75) Inventors: Robert Patti, Warrenville, IL (US); Sangki Hong, Singapore (SG); Ramasamy Chockalingam, Singapore (SG)

(73) Assignee: Tezzaron Semiconductor, Inc., Naperville, IL (US)

( * ) Notice: Subject to any disclaimer, the term of this patent is extended or adjusted under 35 U.S.C. 154(b) by 811 days.

(21) Appl. No.: 11/484,544

(22) Filed: Jul. 10, 2006

(65) Prior Publication Data

US 2008/0006938 A1    Jan. 10, 2008

(51) Int. Cl.
*H01L 21/00*    (2006.01)

(52) U.S. Cl. .................. 257/786; 257/777; 257/782; 257/779

(58) Field of Classification Search .............. 257/777, 257/E23.001–E23.194, 779, 782, 786
See application file for complete search history.

(56) References Cited

U.S. PATENT DOCUMENTS 6,838,774 B2 *   1/2005   Patti .................. 257/773
7,400,134 B2 *   7/2008   Morishita et al. ........ 324/158.1

* cited by examiner

*Primary Examiner*—Leonardo Andújar
(74) *Attorney, Agent, or Firm*—Calvin B. Ward

(57) ABSTRACT

A basic building block for wafer scale stacked integrated circuits is disclosed. The building block includes an integrated circuit device having an integrated circuit substrate having a circuit layer sandwiched between a buffer layer and a dielectric layer. The dielectric layer has a top side and a bottom side, the bottom side being in contact with the circuit layer. The top surface of the dielectric layer includes a plurality of pads. Each pad extends above the top surface by a predetermined distance. The pads have dimensions that reduce irregularities in the top surface of the pads. In addition, the pads are arranged in a manner to promote planarization of the surface of the wafer via CMP.

17 Claims, 10 Drawing Sheets

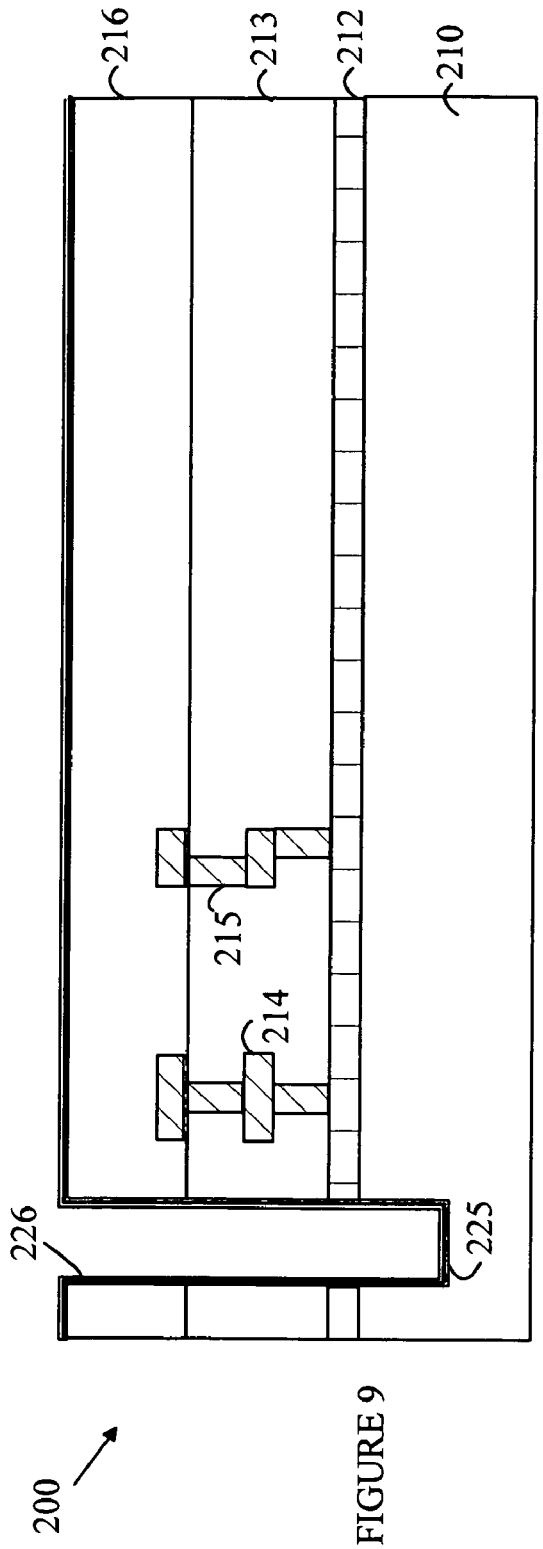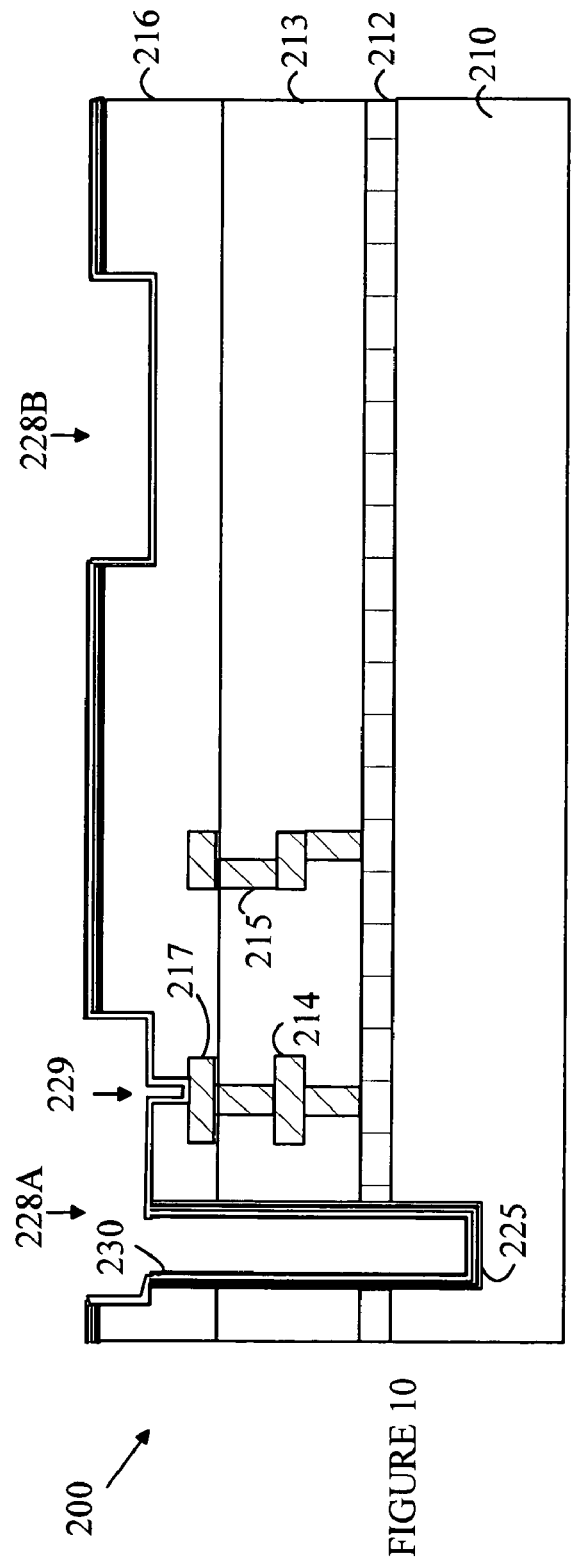

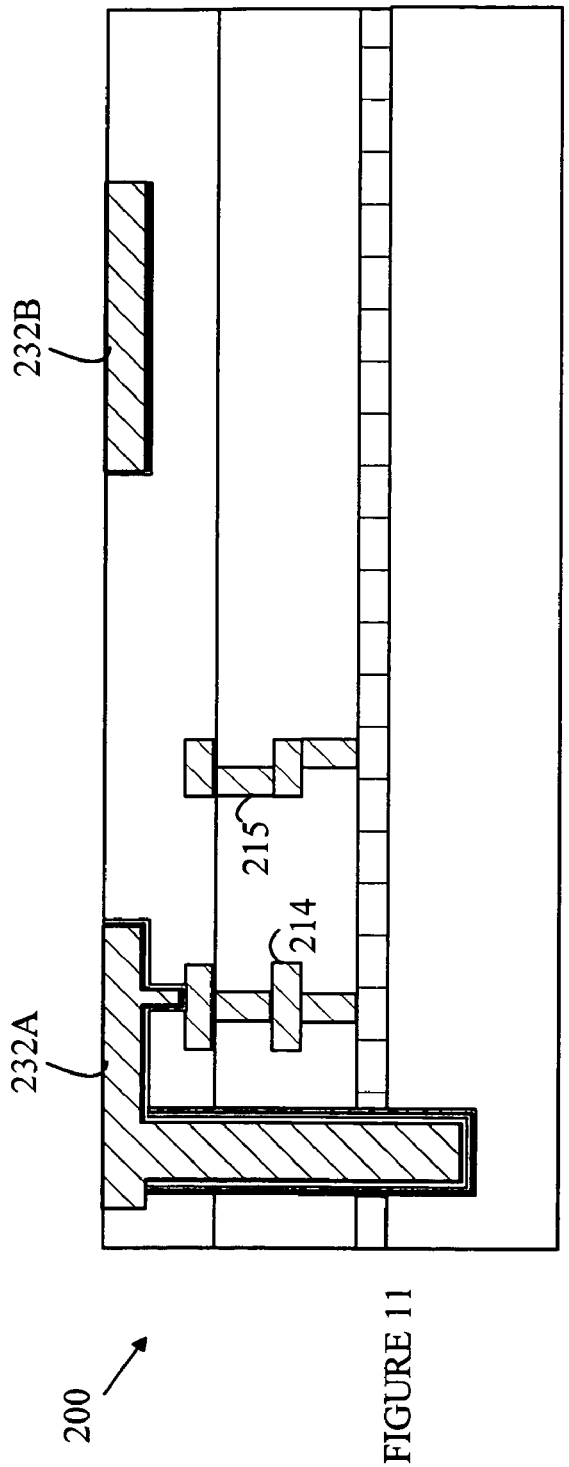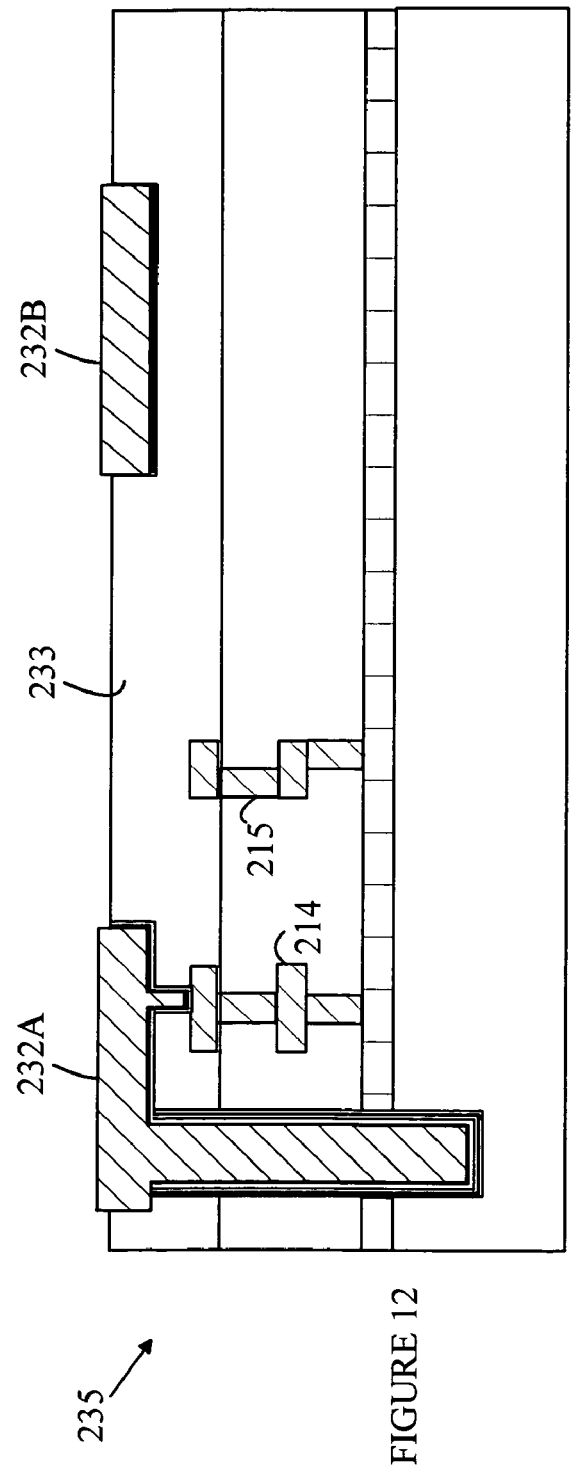

METHOD FOR BONDING WAFERS TO PRODUCE STACKED INTEGRATED CIRCUITS

BACKGROUND OF THE INVENTION

Modern integrated circuits are typically constructed in a thin layer in a semiconducting layer on a substrate wafer such as silicon. This essentially two-dimensional structure limits both the size of the integrated circuit and the speed at which the circuit operates. The distance between the farthest separated components that must communicate with one another on the chip determines the speed at which an integrated circuit operates. For any given number of components, the path lengths will, in general, be significantly reduced if the circuit can be laid out as a three dimensional structure consisting of a number of vertically-stacked layers of circuitry, provided the vertical distance between the layers is much smaller than the width of the chips that make up the individual layers.

The circuitry that can be economically constructed on any type of wafer is limited. For example, the fabrication processes utilized for constructing CCD optical sensors do not lend themselves to constructing CMOS logic circuits. Hence, an optical sensor having a CCD array and the corresponding logic circuits must be broken into two substrates that are connected electrically after the circuit elements on each substrate have been fabricated. Such hybrid circuits are limited in the number of inter-substrate connections that can be utilized.

One promising scheme for providing such stacked structures utilizes a method for stacking and bonding entire wafers. In this method, integrated circuits are fabricated on conventional wafers. The circuitry on the front surface of each wafer is covered with an insulating layer having metallic pads that make contact with the underlying circuitry and act as electrical connection points between the two wafers. The front surfaces of the wafers are then placed in contact with one another and bonded via thermal compression bonding. If more than two wafers are to be connected, one of the wafers is then thinned to a thickness of a few microns by etching or mechanically grinding the back surface of that wafer. Once the wafer has been thinned, a new set of pads is constructed on the backside of the thinned wafer. Some of these backside pads are connected to the circuitry on the front side of the wafer through vias that connect the front and back sides of the thinned wafer. These backside pads provide the connection points for adding yet another wafer to the stack. The process is then repeated until the desired number of layers has been bonded to form the three-dimensional stack. The three-dimensional stack is then cut into three-dimensional chips and packaged.

The metallic pads that are used to make circuit connections between the wafers typically have insufficient area to bond the wafers together with sufficient force to withstand the thermal cycling inherent in the fabrication process. Even in circuits that have thousands of circuit connection pads, the fraction of the wafer area that is covered by these bonding points is still a small fraction of the total wafer area. Hence, additional large areas of metal are deposited on each wafer in the areas between the circuit connection pads to provide additional bonds. All of these pads are typically made from the same metal used in the thermal compression bonding of the connection pads, and are bonded during the same thermal compression bonding step.

The bonding process requires that the metal surface on the two wafer surfaces be uniformly flat over the entire 8 to 12 inch wafer to a precision of a fraction of a micron. If the surface of a bonding pad is not flat, the actual area of metal that will be bonded will be only a small fraction of the pad area, and the bond will be prone to failure when the wafer stack is subjected to thermal stresses during subsequent processing.

In general, prior art bonding procedures utilize a chemical-mechanical polishing (CMP) procedure to planarize the surface of the metallic bonding pads prior to the thermal compression bonding step. CMP planarization is typically carried out in an apparatus having planar polishing pads that are moved over the surface of the substrate in the presence of a solution that includes abrasive particles.

Metal CMP processes are now a well-established semiconductor process for manufacturing logic and memory devices. Most of the current metal thin films (W, Cu, Al, Ir, Pt etc) are deposited by PVD, CVD and ECP in order to fill patterns such as trenches, contacts, and vias. For example, a Cu metal thin film is typically deposited by first depositing a PVD seed Cu layer followed by electro-chemically plated (ECP) Cu or chemical vapor deposited (CVD) Cu. After depositing the metal, the surface of the wafer has hills and valleys that can interfere with subsequent deposition steps; hence, the surface is planarized to remove these features and provide a flat surface for subsequent deposition steps.

While CMP has been used successfully for the planarization of wafers having a single surface composition such as $SiO_2$ or Cu, problems are encountered when the procedure is applied to a surface having features that are eroded at different rates by the polishing pads and polishing solution. For example, if large copper pads that are inset in $SiO_2$ are used for the additional bonding pads, the copper in the center of the pad is eroded at a faster rate than the copper on the sides of the pad that are set in $SiO_2$, because the $SiO_2$ erodes at a slower rate than the copper. This differential erosion leads to a pad that is dish-shaped. The bonding area of such a pad will be limited to a ring around the outer edge of the pad, and hence, only a small fraction of the pad area will bond to the corresponding pad on the adjacent wafer. The resulting bond is prone to failure because of its limited bond area.

In addition to failure of the metal-metal bond on the pads, the wafer-wafer bond can fail because the metal bonding pad is pulled off of the underlying $SiO_2$ surface when the bonded wafers are subjected to thermal stress. Wafer-wafer bond failures resulting from the detachment of the metal pads are also observed when prior art stacking procedures are followed.

SUMMARY OF THE INVENTION

The present invention includes an integrated circuit substrate having a circuit layer covered by a dielectric layer having a top surface and a bottom surface. A plurality of pads are disposed on the dielectric layer. Each pad includes a bonding layer that includes a bonding material that extends into the dielectric layer and above the dielectric layer by a first distance. At least one of the pads is connected electrically to the circuit layer. The substrate is divided into a plurality of chip circuit areas. Within each chip circuit area, the pads have a maximum dimension greater than 0.5 µm and less than 20 µm. The pads are arranged in a pattern such that any two adjacent pads are separated by a separation distance of less than 50 µm. In one embodiment, the pads cover between 5 percent and 90 percent of the area of each chip circuit area. In one embodiment, the bonding material includes a material chosen from the group consisting of Ti, TiN, $Ti_xSi_yN_z$, Ta, TaN, W, WN, $Ta_xSi_yN_z$, $W_2$, and $Si_yN_z$. In one embodiment, the pads are arranged in a regular array within each chip circuit area.

The present invention also includes an integrated circuit structure having first and second substrates that are bonded together. The first substrate includes a plurality of first substrate bonding pads on a bonding surface of the first substrate. The first substrate includes an integrated circuit layer having integrated circuit elements. The second substrate includes a plurality of second substrate bonding pads on a bonding surface of the second substrate. Each second substrate bonding pad is in contact with a corresponding one of the first substrate bonding pads. The first and second substrates are divided into a plurality of corresponding chip circuit areas, and within each chip circuit area the bonding pads on the first and second substrates have a maximum dimension greater than 0.5 µm and less than 20 µm. The pads are arranged in a pattern such that any two adjacent pads are separated by a separation distance of less than 50 µm.

In one embodiment, the bonding pads include a bonding pad material and, within each chip circuit area, the surface density of the bonding pad material is constant to within ±10 percent over each area having a maximum dimension greater than 500 µm within the chip circuit area. At least one of the bonding pads in each chip circuit area on each of the first and second substrates is connected to an integrated circuit device within the first and second substrate, respectively. In one embodiment, the bonding pads cover between 5 percent and 90 percent of the area of each chip circuit area on the first substrate. In one embodiment, the bonding pad material includes a material chosen from the group consisting of Ti, TiN, $Ti_xSi_yN_z$, Ta, TaN, W, WN, $Ta_xSi_yN_z$, $W_2$, and $Si_yN_z$. In one embodiment, the bonding pads on the first substrate are arranged in a regular array within each chip circuit area.

BRIEF DESCRIPTION OF THE DRAWINGS

FIG. 9 is a cross-sectional view of wafer 200 after via 220 has been lined with two layers.

FIG. 10 is a cross-sectional view of wafer 200 after trenches have been etched in the dielectric layer.

FIG. 11 illustrates a copper pad that is flush with the surrounding dielectric.

FIG. 12 is a cross-sectional view of a portion of a completed component layer element.

DETAILED DESCRIPTION OF THE PREFERRED EMBODIMENTS OF THE INVENTION

In the following discussion, the term bonding pad refers to the pads used to bond two wafers together without necessarily providing any electrical connections between the circuit elements on the wafers. The term connection pad will be used to distinguish a pad that also provides an electrical connection. The term vertical connection pad refers to a pad that is connected to a via that runs through a wafer. From a wafer to wafer bonding point of view, all of these pads can provide a wafer-to-wafer bond.

Figure 1:
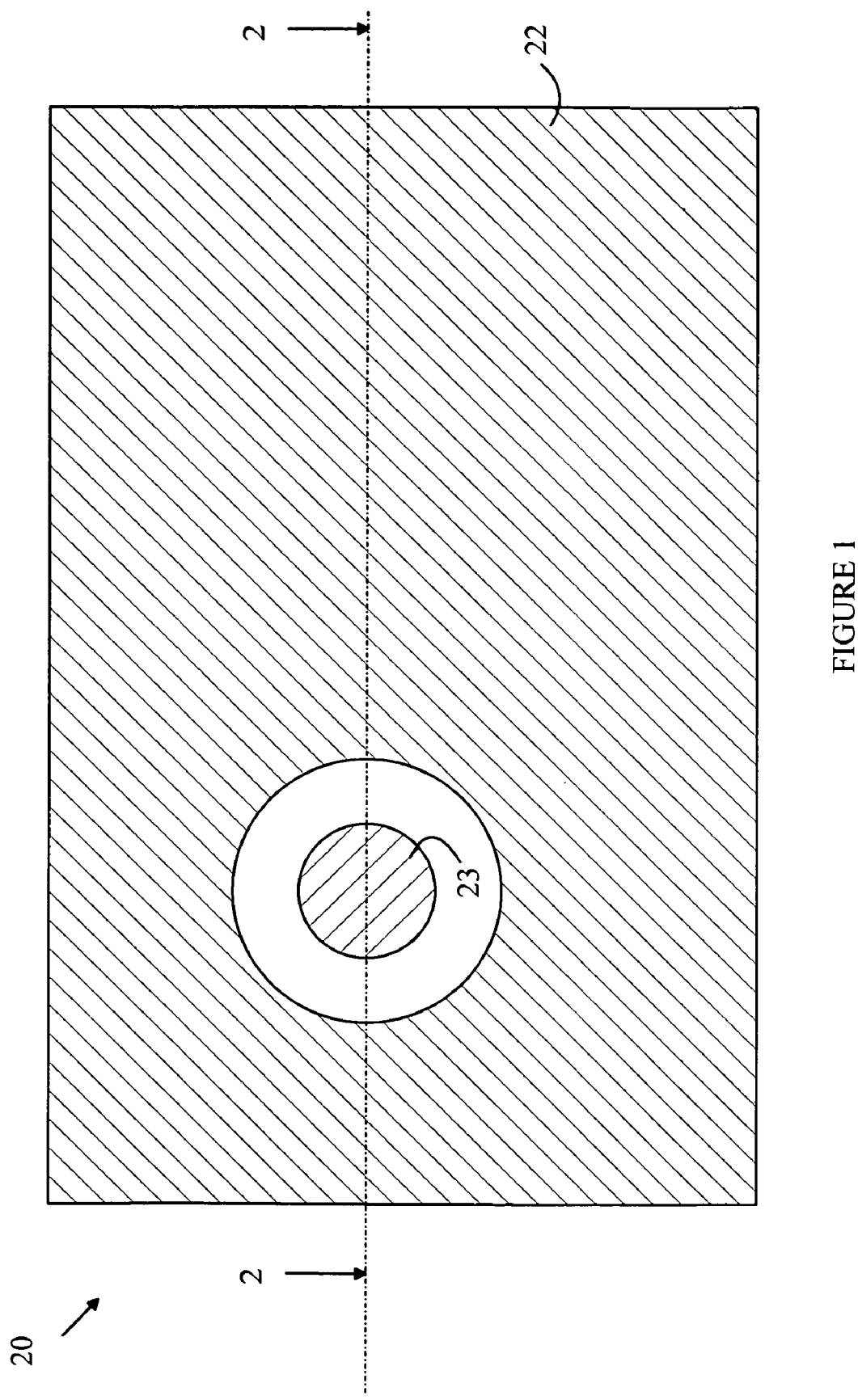
FIG. 1 is a top view of wafer 20 prior to the bonding of wafers to each other.
Figure 2:
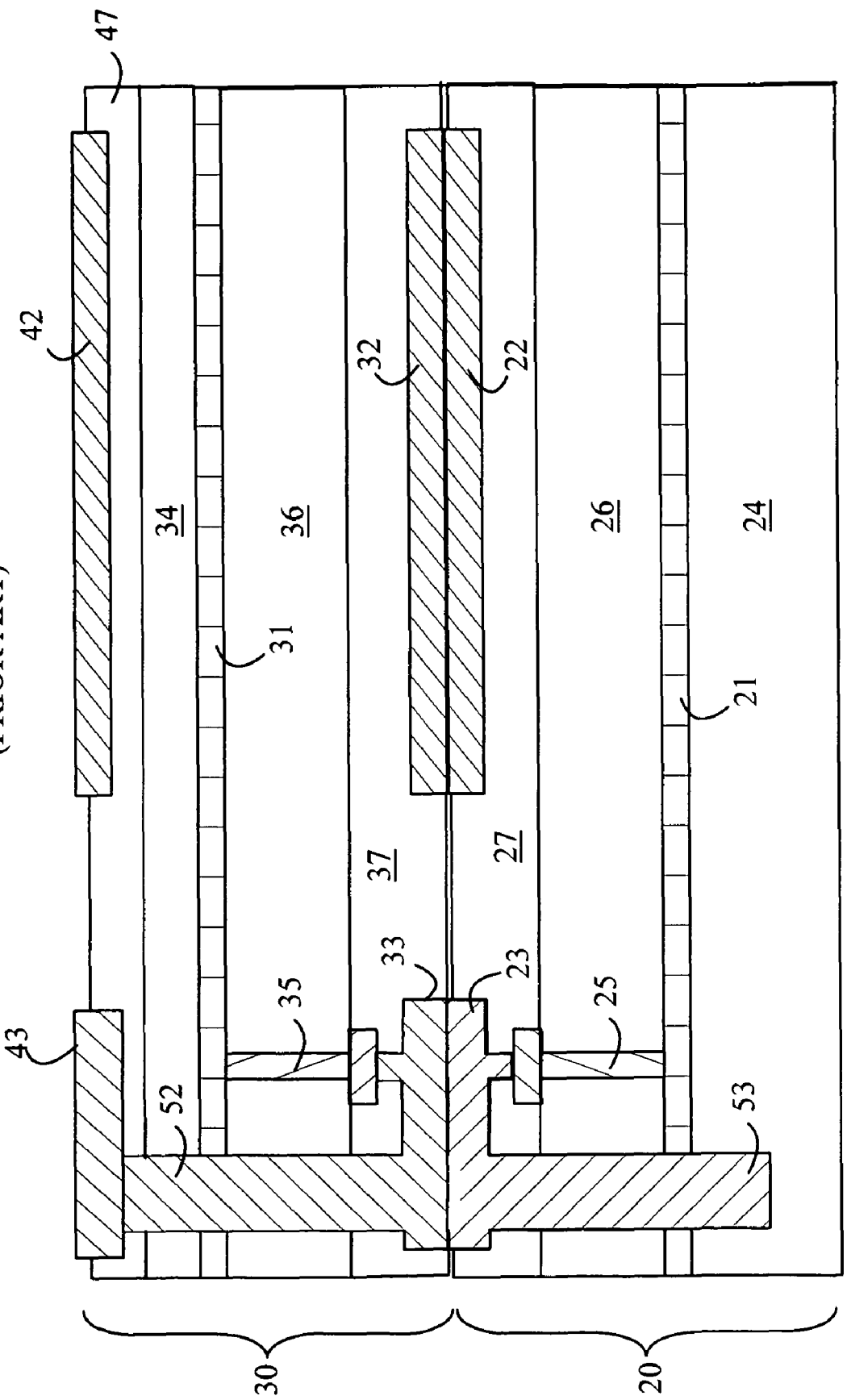
FIG. 2 illustrates the cross-sectional view through line 2-2 shown in FIG. 1.

The manner in which the present invention provides its advantages can be more easily understood with reference to the manner in which one prior art system for stacking integrated circuits operates. Refer now to FIGS. 1 and 2. FIG. 2 is a cross-sectional view of a portion of a pair of stacked wafers. FIG. 1 is a top view of wafer 20 prior to the bonding of wafers 20 and 30 to each other. The cross-sectional view shown in FIG. 2 is through line 2-2 shown in FIG. 1.

Refer first to wafer 20 in FIG. 2. Wafer 20 includes a circuit layer 21 that includes integrated circuit elements that are constructed in the surface layer of a silicon substrate in the conventional manner. The precise nature and structure of these circuit elements is not relevant to the present discussion, and hence, the construction of this layer will not be discussed in detail here. For the purposes of this discussion, it is sufficient to note that the circuit elements are confined to a layer of finite thickness that is located on a silicon buffer layer 24 that is devoid of circuit elements. A dielectric layer 26 is typically formed over the integrated circuit layer and various metal conductors are formed in and/or on this layer. These conductors provide electrical connections to selected ones of the circuit elements in layer 21 and metal connections between various circuit elements in layer 21. An exemplary metal connection is shown at 25.

A second dielectric layer 27 is typically formed on top of layer 26 and provides the foundation for various vias and connection pads that are constructed after the wafer having layers 21 and 26 has been fabricated in a conventional fabrication line. In particular, a via 53 extending from the top surface of layer 27 to a depth below that of circuit layer 21 is constructed. As will be explained in more detail below, the bottom of this via defines the thickness to which the wafer is thinned during the stacking process, and hence, this via must extend into buffer layer 24 to a depth that assures that the integrated circuit elements in layer 21 are not damaged in the thinning process.

A vertical connection pad 23 is constructed in layer 27 and a via connecting connection pad 23 to metal conductor 25 is also formed. Again, the location of vertical connection pad 23 is not limited only to layer 27. For example, a vertical connection pad can be part of layer 26 as well. Via structure 53 as well as a small via connecting it to metal conductor 25, is then filled with metal (W, Cu, Al, Ir, Pt, etc.), preferably copper. The surfaces of pads 22 and 23 are preferably elevated by a small amount above the surface of dielectric layer 27 to facilitate the bonding process.

Additional metal areas that are utilized only for bonding wafers in the stack are also formed in dielectric layer 27. An exemplary bonding pad is shown at 22. This pad is also preferably constructed from copper and has a surface that is raised above the level of the surface of dielectric layer 27 by the same amount as connection pad 23. The bonding pads are preferably separated from the connection pads and vertical connection pads such that the two types of pads are not connected, since such a connection would increase the capacitance of the connection paths between the various circuit elements. The bonding pads cover a substantial fraction of the surface of wafer 20 and are responsible for holding two stacked wafers together with a force sufficient to assure that the wafers will not separate during the subsequent stacking operations or in the field during the use of the chips derived from the stacked wafers.

The manner in which a number of wafers such as wafer 20 are stacked to form a stacked assembly will now be discussed in more detail. The stacking process is an iterative process in which one wafer is added at a time to an ongoing stacked assembly. At any point in the stacking process there is a base wafer assembly comprising one or more wafers that have been previously stacked and a new wafer element that is to be added to the stack. The process starts with wafer 20 as the base wafer assembly. The process starts by adding a second wafer, e.g., wafer 30, to wafer 20. When wafer 30 is added to wafer 20, it is face down relative to the orientation of wafer 20, which is defined to be face up. Wafer 30 is structurally similar to wafer 20 in that wafer 30 includes an integrated circuit layer 31 that is constructed on a silicon wafer leaving a buffer layer 34 that is devoid of integrated circuit elements or conductors associated with those elements with the exception of vertical metal filled vias such as via 52. Wafer 30 also includes dielectric layers 36 and 37 that serve functions analogous to dielectric layers 26 and 27, respectively. Connections between circuit elements in circuit layer 31 or in other layers are made via metal conductors in dielectric layers 36 and 37. An exemplary connection conductor is shown at 35. If a circuit element in layer 31 is to be connected electrically to a circuit element or conductor in another component wafer such as wafer 20, the conductor in question may also be connected to a connection pad associated with one of the vertically running conductors. In the case of the elements connected to conductor 35, the connections to off wafer conductors are made utilizing metal filled via 52 via connection pads 33 or 23. It should be noted, however, that a circuit element in one wafer can be connected to a circuit element in another layer without a further connection to a metal filled via that runs beyond the two mating surfaces of the wafers.

Wafer 30 is bonded to wafer 20 by aligning the wafers such that the various connection pads and bonding pads are opposite to one another. For example, bonding pad 22 is aligned with bonding pad 32. The two aligned wafers are then pressed together and heated such that thermal diffusion bonding occurs, and the connection and bonding pads on wafer 20 are thus bonded to the corresponding pads on wafer 30. For copper connection and bonding pads, the wafers are pressed together with a pressure of approximately 40 psi in a vacuum or nitrogen environment and heated at a temperature of 400 C for approximately 30 minutes.

After the bonding process is completed, wafer 30 is thinned by removing material in layer 34 utilizing mechanical grinding and/or chemical-mechanical polishing and/or wet or dry etch processes that removes all but a few microns of layer 34. The thinning process utilizes multi-layers of barrier materials in the bottom of via 52, which were deposited prior to filling the vertical via with metal. These barrier materials provide electrical isolation between the vertical via metal layer and buffer silicon layer 34 and are used to control the final thickness of layer 34. This thinning operation leaves the end of metal filled via 52 exposed. After wafer 30 has been thinned, a new set of connection and bonding pads is fabricated on dielectric layer 47 and deposited on the backside of wafer 30 as shown at 42 and 43. These bonding pads provide the connection and bonding points for the next wafer that is added to the stacked assembly or, in the case of the last wafer in the stack, the terminals for connections to circuitry that is not part of the stacked assembly. After the last wafer is added to the stack, the wafer is cut into individual stacked integrated circuit chips for packaging, etc.

It should be noted that the above-described procedure requires that the pads on each wafer be on a planar surface and extend therefrom by a small amount that is the same across the wafer. The embodiments discussed above represent the ideal case. That is, each of the pads is a planar surface that mates with a corresponding planar surface on the adjacent wafer. The manner in which the pads are planarized will be discussed in detail below. For the purposes of the present discussion, it is sufficient to note that the planarization depends on one or more CMP operations to assure that the surfaces of the pads are planar. In practice, the pads that result from these prior art procedures have a surface that differs significantly from the ideal planar surface.

Figure 3:
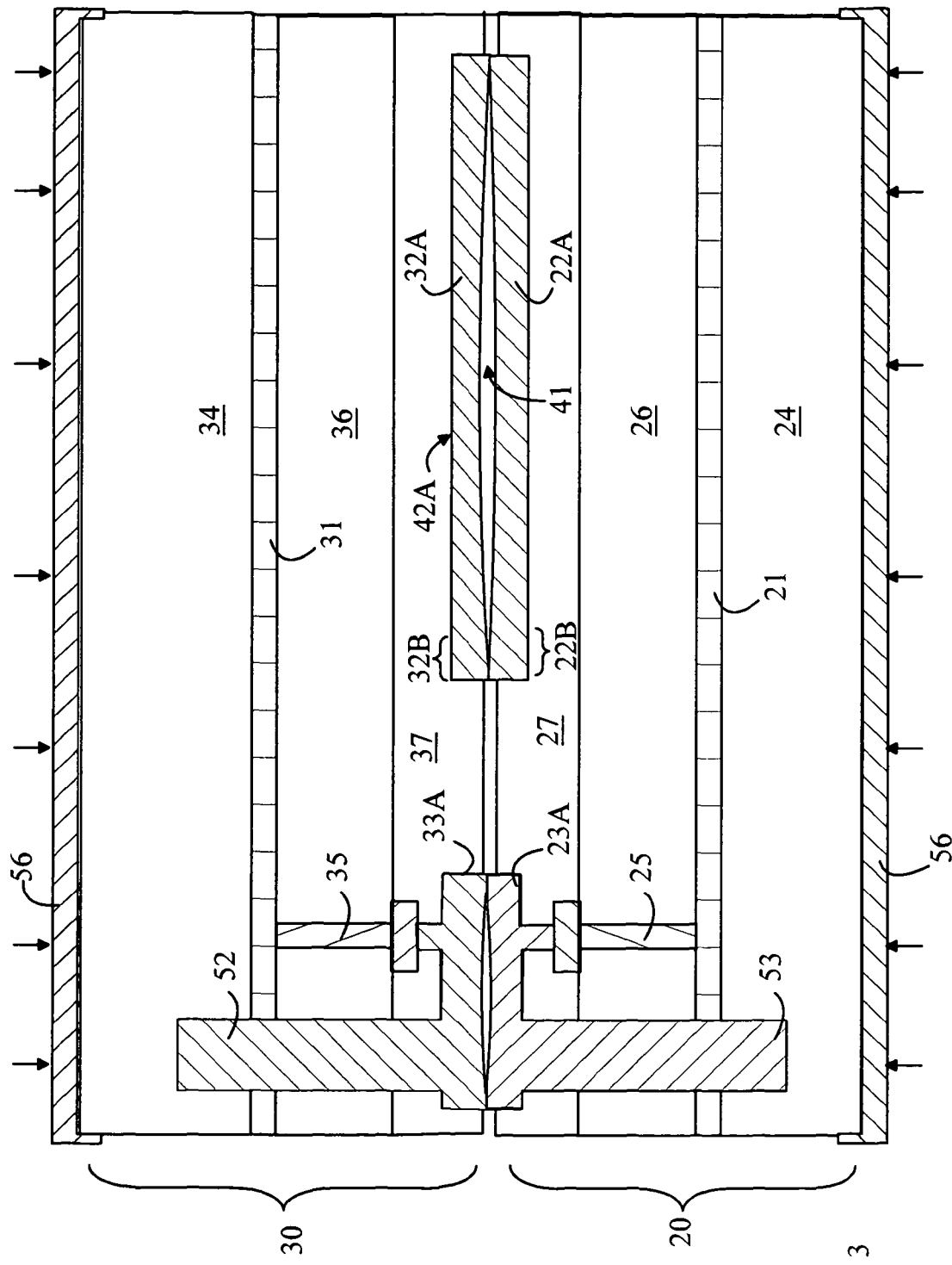
FIGS. 3 and 4 are cross-sectional views of the wafers shown in FIG. 2 at the point in the bonding procedure at which wafer 30 is positioned for bonding to wafer 20.

Refer now to FIG. 3, which is a cross-sectional view of the wafers shown in FIG. 2 at the point in the bonding procedure at which wafer 30 is positioned for bonding to wafer 20. The two wafers are held in a chuck 56 that applies pressure to the wafers during the bonding process as indicated by the arrows. In practice, the CMP process erodes the copper pads more rapidly than the surrounding material, which is typically $SiO_2$. As will be explained in more detail below, the copper pads are deposited in trenches in the $SiO_2$. To prevent the copper from diffusing into the surrounding circuitry, the trenches are lined with a diffusion barrier such as Ta. Both the $SiO_2$ and Ta erode at a slower rate than the copper during the CMP process. As a result, the center region of the copper pads erode faster than the regions near the edges of the pads. This leaves a dished surface on each pad. Exemplary dished pads are shown at 22A, 23A, 32A and 33A. When the pads are forced together during the bonding process, a gap such as gap 41 remains between the pads. As a result, the pads only bond in small areas at the edges of the pads, as shown at 32B and 22B. This small bonding area has insufficient area and often fails under thermal stress.

Even if the copper-copper bond holds, the large bonding pads often break free of the $SiO_2$ surface along the $SiO_2$-barrier metal-copper boundaries, such as boundary 42A. The force that can be applied to hold the copper pads in place is proportional to the surface area of the copper-barrier metal-$SiO_2$ boundary. For large connection pads, this is essentially the area of the bottom of the copper pad. Hence, to improve this bond, some mechanism for increasing the surface area is needed.

Figure 4:
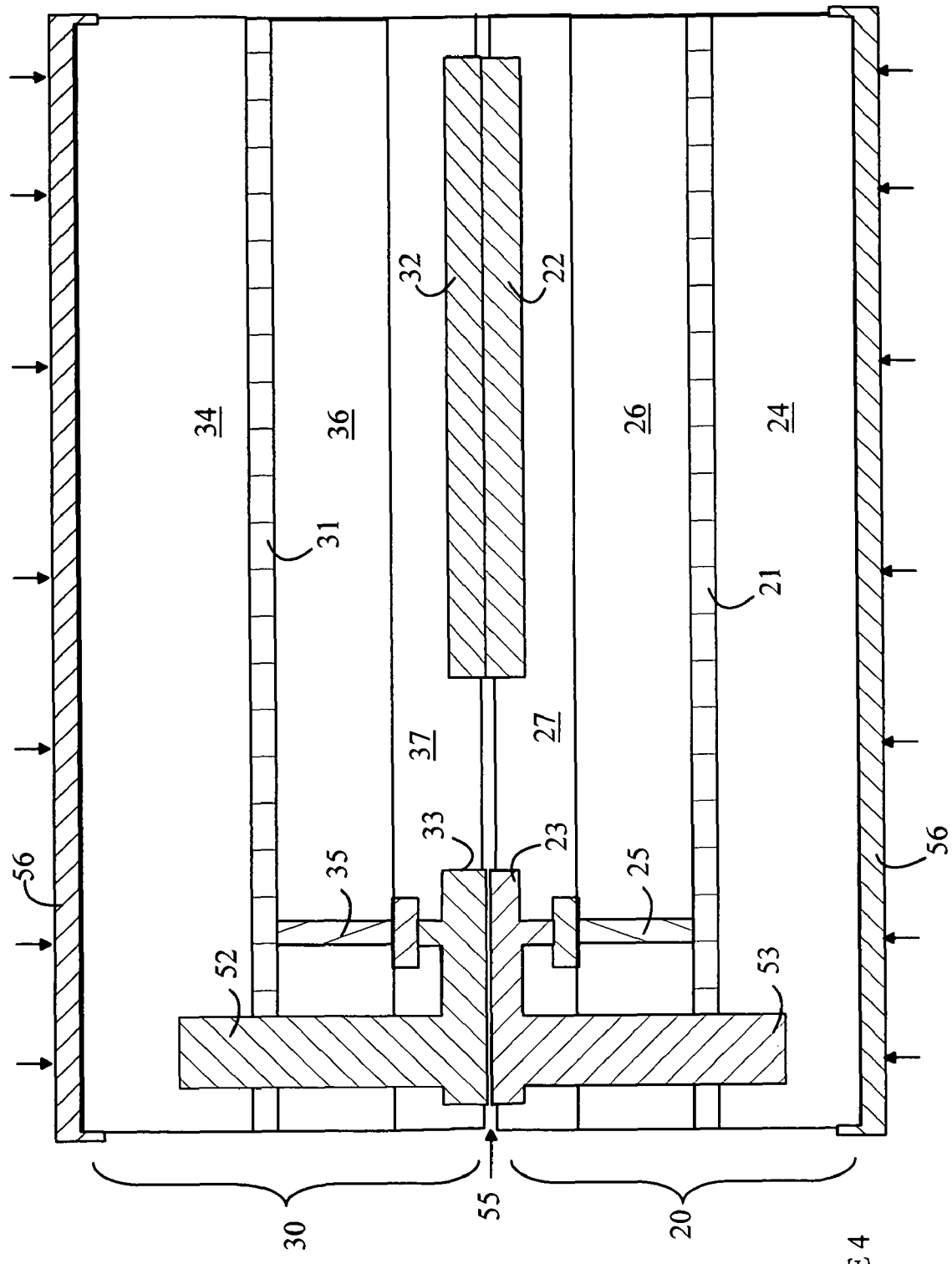

Another problem that causes a failure of the stacked parts is related to bond failures that occur because the bonding pads are at slightly different heights with respect to the underlying $SiO_2$ surfaces. Refer now to FIG. 4, which is a cross-sectional view of the wafers shown in FIG. 2 at the point at which wafer 30 is positioned for bonding to wafer 20. For the purpose of this example, it will be assumed that bonding pad 22 extends above the surface of wafer 20 more than connection pad 23 due to the variability of the fabrication process used to generate the pads. In this case, the wafers will be separated sufficiently to prevent connection pad 23 from contacting connection pad 33 during the bonding process. That is, there will be a gap between connection pads 23 and 33 as shown at 55, and hence, a proper bond will not be formed between connection pads 23 and 33. This can lead to an open circuit in the final chip.

Hence, either the height of the various pads above the wafers must be controlled to a very high degree or some mechanism that permits variability in the pad height must be utilized. The cost of providing the necessary precision by controlling the pad height is too great and/or the available yields utilizing the best current technology are too low to provide economically viable parts by stacking.

Similarly, methods that rely on the flexibility of the wafer itself do not perform adequately. Consider the case in which two of the pads that are to be bonded together are separated by a distance that is greater than the separation of the surrounding pads and hence, there is a gap such as gap 55. Chuck 56 has rigid surfaces that engage the surface of each wafer. A pressure is applied to the chuck to force the wafers together. Even if the wafers are flexible enough to deform to close gap 55, the chuck cannot apply a sufficient force between pads 23 and 33. As the chuck force is increased, the increased force is countered by the reaction force between the pads that are already in contact, e.g. pads 22 and 32 and similar pads on the other side of pads 23 and 33 that are not shown in the drawing. Since these pads do not compress, the additional force appears across these pads and not across pads 23 and 33. To apply a force that closes gap 55, the chuck would also have to have a protrusion that differentially applies a force over pads 23 and 33. Since the location of the gaps is not known in advance, such a chuck is not practical.

There is an additional problem inherent in utilizing a flexible wafer during the bonding process. As noted above, the wafers must be forced together during the bonding process by applying a force to the wafers through the planar surface of the contact member of a chuck. If the surface of the chuck has any small protrusions or recessed areas, the areas of the wafer under these non-planar features will be pressed together with more or less force, respectively, than the areas under the planar portions of the chuck. In particular, the areas under a protrusion in the chuck surface can deform the flexible membrane and produce gaps between the bonding and connecting pads in the vicinity of the protrusion. Hence, an absolutely flat chuck surface that is free from debris must be utilized. However, to align the wafers prior to bonding, the chuck must have clear window areas so that the fiducial marks used to align the wafers can be viewed. Providing a surface that includes such windows and is flat to a precision of less than a micron is difficult.

Figure 5:
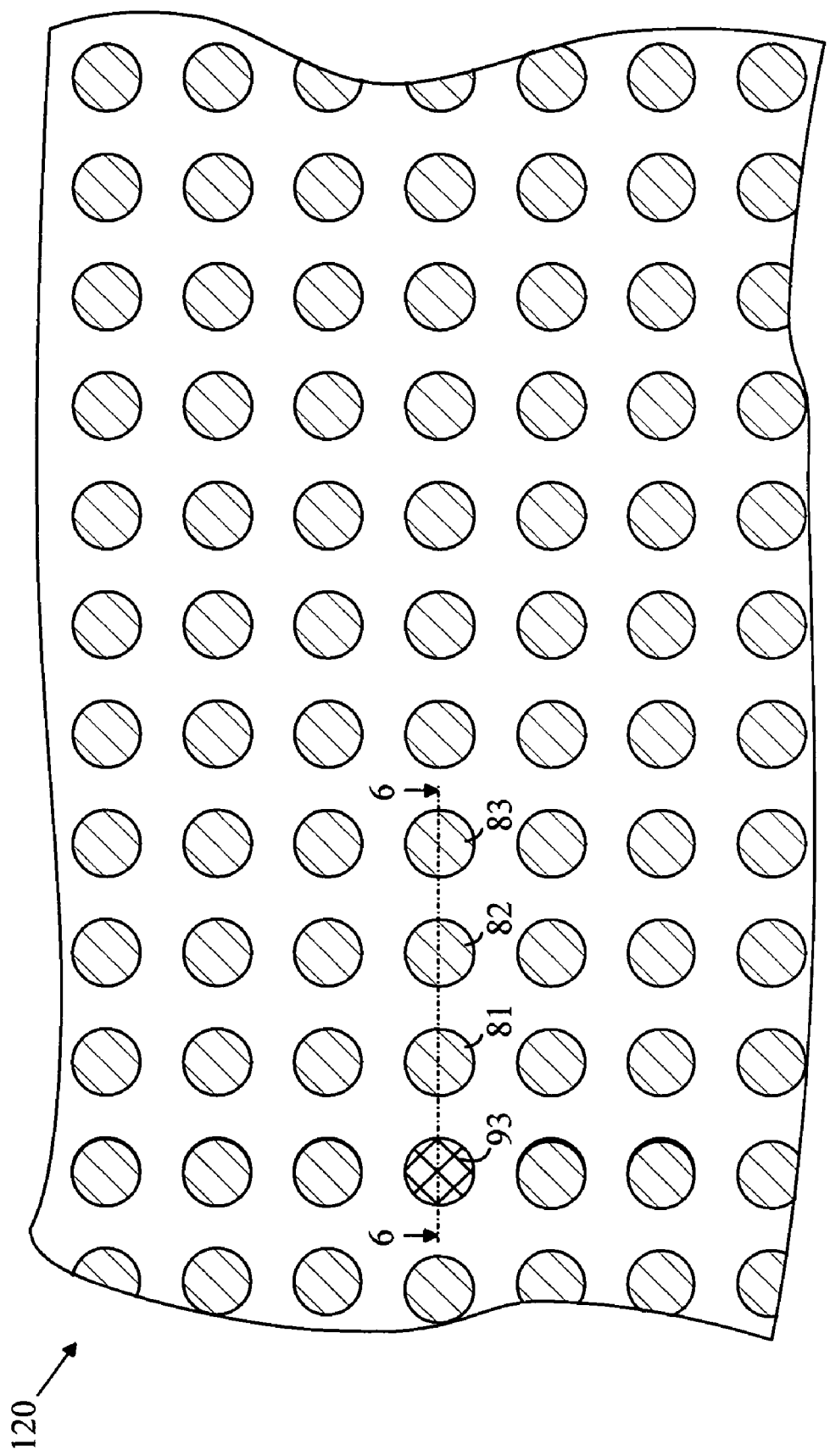
FIG. 5 is a top view of a portion of a component wafer in one embodiment of a stacking system according to the present invention.
Figure 6:
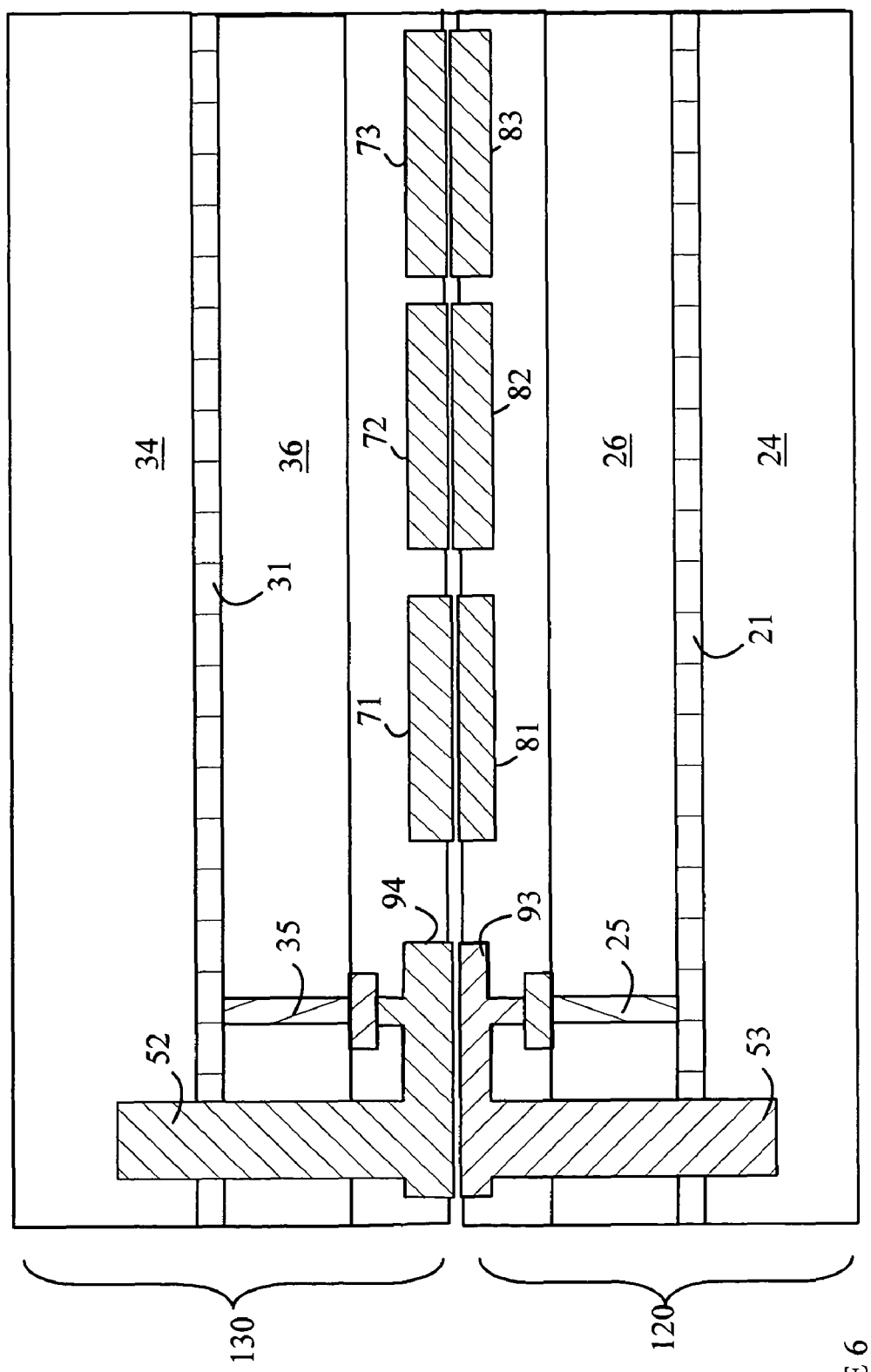
FIG. 6 is a cross-sectional view of wafer 120 through line 6-6 shown in FIG. 5.

Refer now to FIGS. 5 and 6. FIG. 5 is a top view of a portion of a component wafer utilized in one embodiment of a stacking system according to the present invention. FIG. 6 is a cross-sectional view of wafer 120 through line 6-6 shown in FIG. 5 positioned for bonding to a second wafer 130. To simplify the following discussions, those elements of wafer 120 and wafer 130 shown in FIG. 6 that serve functions analogous to elements shown in FIGS. 2 and 3 have been given the same numeric designations and will not be discussed in detail here. Referring again to FIGS. 5 and 6, in one embodiment of the present invention the portions of the bonding pads and connection pads that make connection with one another have the same dimensions on the surface of the wafer and the same shape as shown at 81-83 and 93. The corresponding pads, 71-73 and 94 in wafer 130 have the same dimensions. The preferred shape is circular, since a circular cross-section is subject to less dishing during the polishing operation than other shaped pads having the same cross-sectional area. However, other shapes can be utilized depending on the design rules of the fabrication line on which the wafers are made. In particular, very small circular features are not always available. In this case, the circular pad is approximated by the highest order polygon-shaped pad that can be fabricated. For example, if the design rules limit the designer to polygons with, at most, a 45-degree angle between adjacent sides, the connection and bonding pads are preferably implemented as regular octagons.

While circular pads are preferred, other factors must be balanced in choosing the shape and dimensions of the pads. There are four design parameters that must be considered in addition to the shape of the pads. First, the bonding and connection pads must have sufficient contact area to bond the wafers together. The precise fraction of the area needed to provide sufficient bonding will depend on the wafer diameter and the pad material. In addition, the temperature variations to which the wafers will be subjected in additional bonding steps must also be taken into consideration. In general, a contact area between 15 and 60 percent of the wafer area has been found to be satisfactory for 8-inch diameter wafers and copper pads. However, embodiments having as little as 5 percent or as much as 90 percent of the wafer area covered in metal can be utilized. If the circuits being connected require a sufficiently large number of connection pads, most of the bonding pads that are interior to the final die and which function solely to bond the wafers together can be eliminated.

Second, the pads must be arranged in a pattern that does not result in large open areas between the pads while providing sufficient space between the pads to assure that shorts do not develop between adjacent connecting pads or a bonding pad and a connection pad. Large open areas will cause the wafer being thinned to flex in the upward direction relative to the base layer or layers in the open areas. If the wafer flexes in the upward direction, it can be damaged in subsequent thinning operations, since the polishing step that thins the wafer will cut into this "bubble". To prevent such bubbles, the wafer must be substantially ridged in the regions between the pads. It has been found experimentally that for silicon wafers, the open area between pads cannot be greater than 50 µm, and preferably not greater than 20 µm for silicon circuit layers that are less than 10 µm.

While a short between a connection pad and a bonding pad is not fatal, the additional pad area that results from connecting a connection pad and a bonding pad increases the capacitance of the vertical conduction path to which the connection pad belongs. It should be noted that the present invention is significantly better than prior art systems that utilize large bonding pads in this regard, since the additional capacitance resulting from a short between a connection pad and a single bonding pad is about the same as that of the connection pad itself in the present invention as opposed to a substantially larger increase with prior art bonding pads.

Third, the diameters of the pads must be chosen to balance two considerations. First, the pad diameter must be large enough to assure that small errors in aligning the wafers with respect to one another do not result in the pad contact area being significantly less than the pad area. Second, the pad diameter must be small enough to assure that the pads will be sufficiently compliant to compensate for small errors in pad height over the wafer and to assure that any dishing in the surface of the pad due to the differential erosion of the pad material relative to the surrounding material is minimized. Finally, embodiments in which the bonding pads and connection pads are the same size and shape are preferred.

Finally, the density of metal per unit area is preferably constant over the surface of the wafer. As noted above, the bonding pads and connection pads are formed by depositing a patterned metal layer on the surfaces to be bonded and then planarizing that surface utilizing CMP. If the patterned metal layer has a region with a significantly higher density of metal than the surrounding areas, the CMP will erode the pads in the higher density region more than those in the surrounding regions, which, in turn, leads to a lack of uniformity in the pad heights above the substrate.

In principle, this type of differential erosion can be avoided by utilizing a metal pattern that is identical over the entire wafer. For example, the metal pads on the surface could be identical to one another independent of whether the pads are bonding pads or connection pads of some type. In addition, the pads would be arranged in a pattern that presents the same density of metal to the polishing pads at each location on the surface.

It should be noted that the density of metal per unit area on the surface depends on the size of the area being considered. Consider a pattern in which the surface is covered by circular pads of diameter D that are separated by a distance of 2D from each other. If one measures the percentage of the surface area that is covered by metal within each area, and the area is chosen to be much smaller than the diameter of a pad, D, e.g. D/10. The result would vary from 0 to 100 percent depending on whether the area was totally between two pads, totally on a pad, or somewhere overlapping an edge of a pad. If on the other hand, the sampling area is chosen to be large compared to the pad diameter, the density of material would appear to be nearly constant. The present invention is based on the observation that the CMP polishing pads are not sensitive to fluctuations in the metal density in areas below a critical region size. That is, for any given CMP apparatus and polishing regime, there is a critical region size below which the CMP erosion rate is only sensitive to the average metal density within that region.

Hence, the pad diameters and metal deposition pattern should be chosen such that the metal density per critically sized region is constant. That is, if one moves a window of the critical size over the surface of the wafer and measures the fraction of the surface area within that window that is covered with metal, the fraction in question should be a constant independent of the position of the window. In practice, the fraction need only be constant to within some predetermined value. In addition, the fraction will obviously vary at the edges.

The critical region is typically a circular area having a diameter within which the polishing pads do not deform locally, and in which the pads remain ridged. For example, in the case of copper polishing pads having a diameter between 500 μm and 1,000 μm, the percentage of the surface that is covered with metal above any area of the diameter of a polishing pad should be the same to within ±10%. For other metals, surface materials, and pad configurations, a similar constraint can be derived by trial and error. In general, the critical area is the area over which the surface appears approximately constant to the CMP polishing apparatus independent of the details of the metal pattern within the region.

In the preferred embodiment, the bonding pads and connection pads have the same shape and diameter and are arranged in a regular array within the region of each die that contains the circuit layer. This arrangement presents the most uniform surface to the polishing pads, and hence, minimizes the problems resulting from uneven erosion of the pads in different areas of the wafer.

In one exemplary design utilizing 8 inch wafers, the copper pads have a height that is 0.05 μm above the wafer surface and have an octagonal shape with the largest cross-sectional dimension being between 0.5 μm-20 μm. The number of pads is chosen such that the pads cover at least 5 percent of the wafer surface. The pads are arranged in a hexagonal array to provide more uniform spacing between the pads. Pads of this diameter are sufficiently small to prevent significant dishing of the pad surfaces during the CMP polishing operations.

While copper is the preferred metal, embodiments of the present invention that utilize copper, tungsten, platinum, tita-nium, gold, silver or combinations thereof can also be constructed. In addition, aluminum can be utilized if the bonding is done in an atmosphere that prevents oxide formation.

Figure 7:
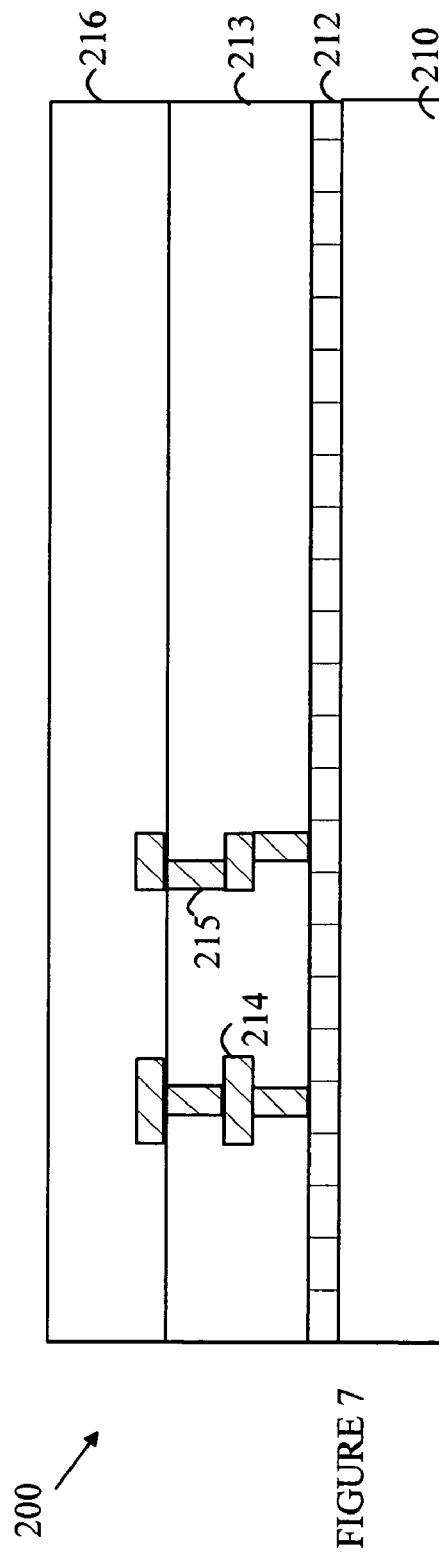
FIG. 7 is a cross-sectional view of a wafer 200 used as a starting point for a component layer in a stacked wafer assembly.

Refer now to FIG. 7, which is a cross-sectional view of a wafer 200 used as a starting point for a component layer in a stacked wafer assembly. It will be assumed that wafer 200 has its active circuit layer 212, which is covered with a dielectric layer 213, in place and that all of the integrated circuits in active circuit layer 212 are confined to layer 212 or the dielectric layers above layer 212. That is, the portion 210 of the substrate under layer 212 is devoid of circuit elements. Various metal conductors such as conductors 214 are typically constructed in the dielectric layer 213 and connected to the circuitry by metal filled vias such as via 215. It will also be assumed that a second layer of dielectric 216 covers the conductors.

Figure 8:
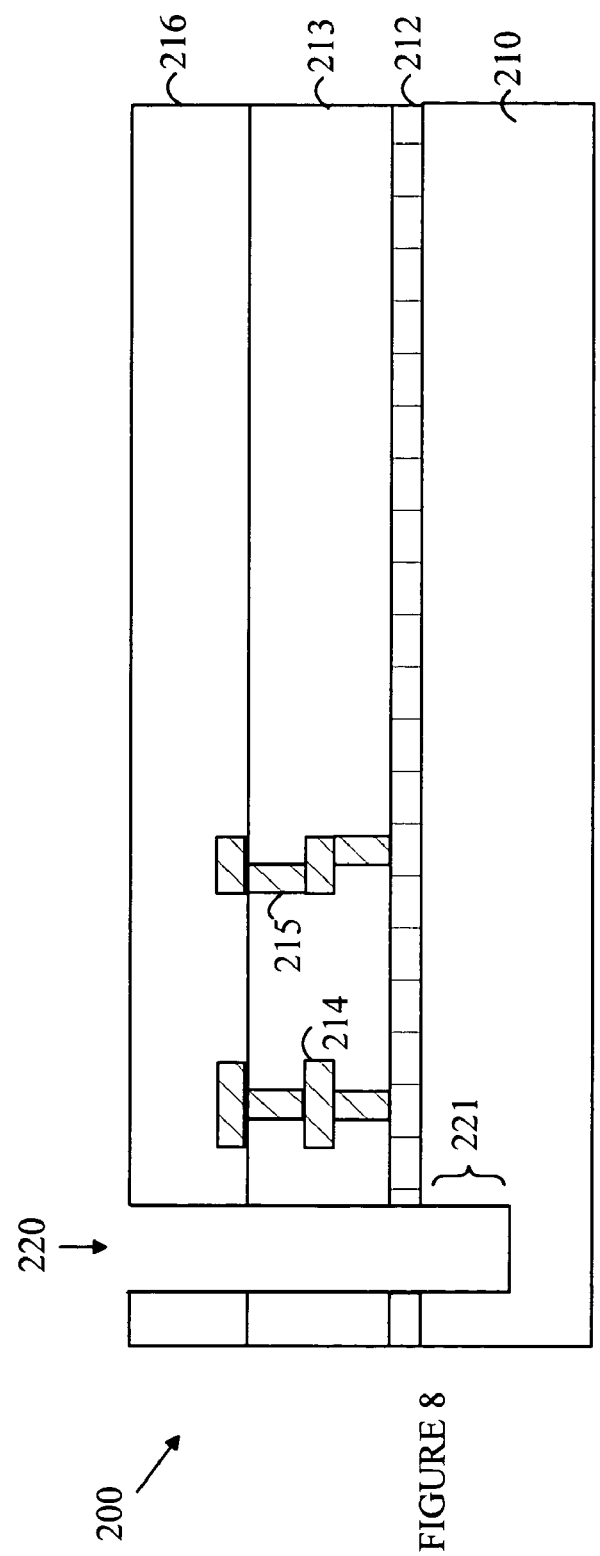
FIG. 8 is a cross-sectional view of wafer 200 after a via has been etched through the dielectric layers and into the substrate layer.

Refer now to FIG. 8, which is a cross-sectional view of wafer 200 after a via 220 has been etched through the dielectric layers and into substrate layer 210. As will be explained in more detail below, the depth 221 by which via 220 extends into substrate layer 210 is critical. Preferably, via 220 is etched in two steps. In the first step, the via is etched using an etchant that stops on the silicon substrate such as a fluorocarbon-based plasma etch. In the second step, the via is extended into substrate layer 210 by 4 to 9 microns using a timed halogen-containing gaseous plasma. It should be noted that the placement of the vias can be controlled precisely, since the wafer has fiduciary marks that are visible from the front side of the wafer, and these marks can be used to align the masks that define the via locations using conventional alignment tools.

Refer now to FIG. 9, which is a cross-sectional view of wafer 200 after via 220 has been lined with two layers. Layer 225 consists of a thin dielectric layer, preferably 0.05 to 0.30 microns of $SiO_2$. This layer acts as an electrical insulator to prevent shorting between the metal layer of the filled via and components in the integrated circuit layer 212. The second layer 226 consists of a thin layer of SiN, typically 0.05 to 0.10 microns in thickness. The SiN layer serves two functions. First, it provides a diffusion barrier that helps to prevent the metal used to fill via 220 from diffusing into the integrated circuit layer if the primary diffusion barrier discussed below fails. Second, the silicon nitride provides an etch stop for the chemical etching process used in the thinning of the silicon wafer. For example, the silicon can be thinned using a wet chemical process such as a substituted ammonium hydroxide or other alkaline chemical etch. It should also be noted that this etch stop will provide some resistance to acidic etch solutions. In this case, the silicon nitride acts as the etch stop. If a dry etch such as a $Cl_2$ based plasma chemistry is used to thin the silicon, the $SiO_2$ layer can be used as an etch stop.

Refer now to FIG. 10, which is a cross-sectional view of wafer 200 after trenches 228A and 228B have been etched in dielectric layer 216. A via 229 is opened in the bottom of trench 228A to provide contact with pad 217 that provides electrical connection to components in circuit layer 212 that are to be connected to the vertical conductor that will be formed by filling via 220 with metal. When filled, trench 228A will become a connection pad, and trench 228B will become a bonding pad.

A third layer 230 is deposited in via 229 and trenches 228A and 228B. Layer 230 serves two functions. First, layer 230 acts a diffusion barrier that prevents the metal used to fill the via and trench from diffusing into the remainder of the wafer. In the preferred embodiment of the present invention, the preferred metal is copper. The diffusion barrier is preferably Ti, TiN, Ta, TaN, or WN or other ternary barrier material such as $Ti_xSi_yN_z$, $Ta_xSi_yN$, $W_2Si_yN$, etc. A 200-1000 A° barrier layer is preferably deposited by a CVD or PVD process such as sputtering. Second, the portion of layer 230 at the bottom of via 220 acts as a stop in the wafer thinning process described below. Trenches 228A and 228B are then filled with metal.

The preferred metal for the filling operation is copper. In embodiments utilizing copper, a copper seed layer is deposited in the trench and vias prior to the deposition of the copper. The seed layer can be deposited utilizing CVD or a sputtering process. The seed layer maintains the proper conduction during the subsequent electro-plating process utilized to deposit the metallic copper. After the seed layer is deposited, the trench is filled with copper using electrochemical plating. The excess copper is removed by chemical mechanical polishing (CMP), leaving a copper pad that is flush with the surrounding dielectric as shown in FIG. 11. In the preferred embodiment of the present invention, the final copper pads 232A and 232B are elevated relative to the surrounding dielectric layer 233 by 0.01-0.5 microns as shown in FIG. 12, which is a cross-sectional view of a portion of a completed component layer element 235. This slightly elevated pad provides improved bonding when the component layer element is bonded as described below. The elevation of the pad can be accomplished by lowering the surrounding dielectric layer or by increasing the height of the copper. The dielectric layer can be lowered by selective etching using a fluorine containing etch process. The copper height can be increased by electroless deposition of additional copper, which will occur only on the exposed copper surface.

As noted above, the CMP polishing is utilized to remove the excess copper and leave the surfaces of the copper pads in the same plane. The amount of material that is removed by the polishing depends on the surface composition and the chemical solution utilized with the polishing pads. As noted above, copper is removed at a different rate than the surrounding $SiO_2$. In addition, the edges of the copper pads are surrounded by the diffusion barrier material discussed above. This material has a different rate of erosion than either the copper or the $SiO_2$.

In one embodiment, the CMP polishing is carried out in three steps. In the first step, an Alumina-based acidic slurry is used. This solution erodes copper faster than Ta and $SiO_2$. This process is stopped as soon as the Ta barrier layer starts to appear by utilizing an end point detection mechanism. A second polishing step utilizing an Alumina based slurry with a higher pH in the range of 6 to about 10.5 is then used to remove the Ta. It is important to use a slurry composition that provides a removal rate of Ta that is slightly higher than that of Cu and $SiO_2$ in the second polishing stage. This second step leaves the top surface of the copper pads slightly elevated with respect to the surrounding Ta barrier layer surface. Such elevation does not cause a problem if the surfaces of the pads are all in the same plane. The final pad height is determined by a subsequent process that either adds copper or lowers the surrounding area. It should be noted that, if the density of copper on the surface of the wafer does not satisfy the density constraints discussed above, the areas with a lower density of pads will be differentially eroded, and hence, will not lie in the same plane as the tops of the pads in regions having higher densities.

After the height of the copper pads is set, a final polishing step is performed at a buffing station. This step mechanically removes any oxides on the metal surface and does not utilize a polishing slurry. However, a corrosion inhibitor is used during this step. The copper pads are left with a coating of the corrosion inhibitor at the end of the polishing step, and hence are prevented from re-oxidizing. Exemplary corrosion inhibitors include BTA (Benzene Triazole) or ethylenediamine. This coating protects the pads from oxidation during the period of time between the polishing step and the subsequent bonding of the copper pads to corresponding pads on another wafer.

Refer again to FIG. 4. Component wafers 120 and 130 are bonded together using thermal compression bonding. The wafers are bonded by compressing the two wafers using 10-90 psi pressure at 300-450° C. temperature in a vacuum or a nitrogen atmosphere for 5-50 minutes. The coating of BTA or ethylenediamine discussed above is vaporized at the bonding temperatures, leaving the copper surfaces free of oxide that would interfere with the bonding process.

As noted above, both the cross-sectional shape and the density of the pads are preferably substantially constant over the top surface of the new base element. There is an exception to the cross-sectional shape rule at the boundary of each chip within a wafer. The final stacked wafer will be diced into individual stacked chips after the various layers have been added. The boundaries of the layers in the individual stacked chips preferably include a sealing ring that extends around the chip area and provides a barrier against moisture, gases, etc.

Figure 13:
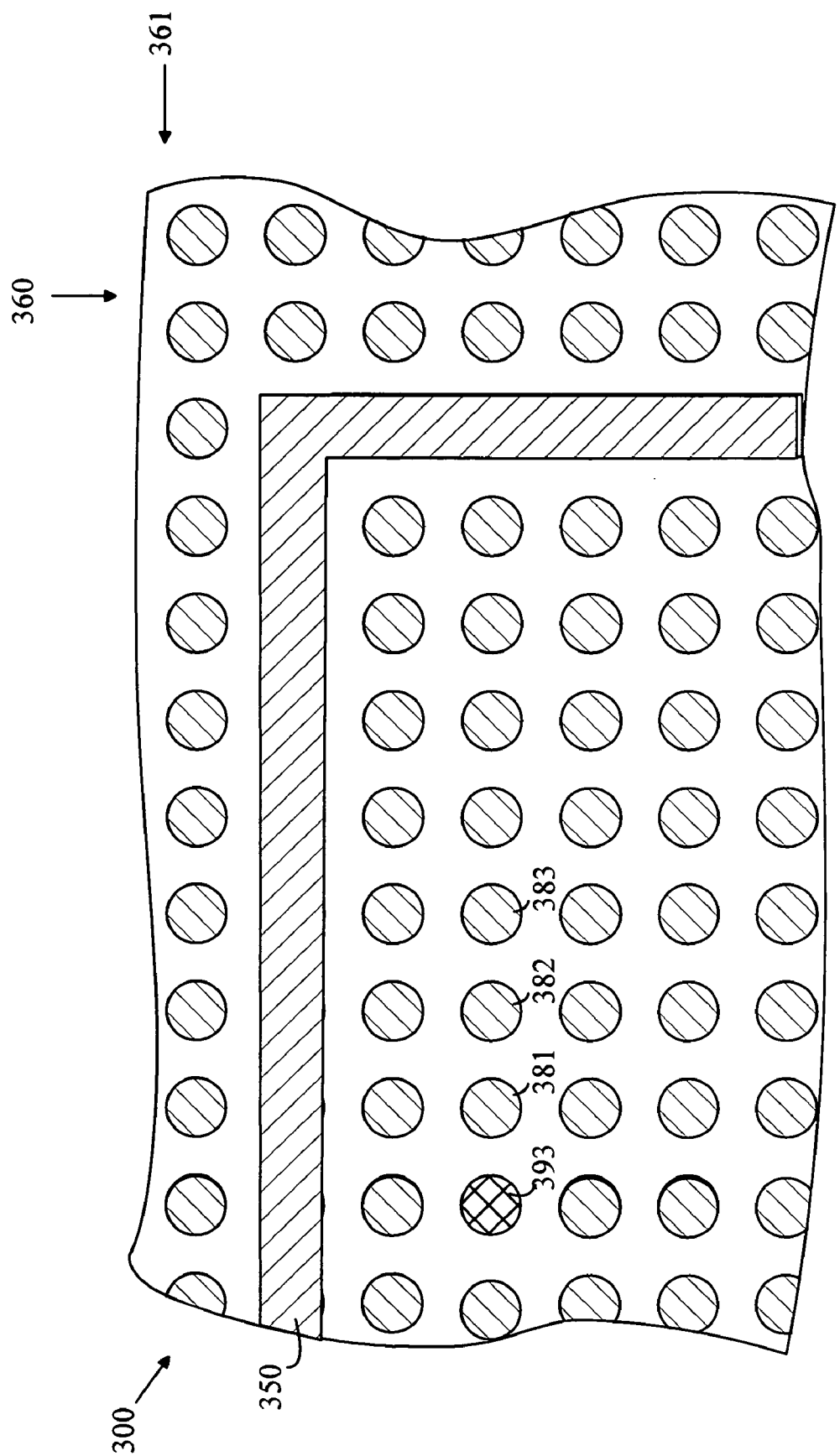
FIG. 13 is a top view of a portion of a component wafer showing a portion of a sealing ring used in one embodiment the present invention.

Refer now to FIG. 13, which is a top view of a portion of a wafer 300 in the region of such a sealing ring 350. The wafer will eventually be diced along the lines shown at 360 and 361 to create the chip within ring 350. The boundary ring 350 is also preferably constructed from copper and includes a copper ridge in the shape of a ring around the edge of the final chip. The width of the ridge is preferably the same as the maximum dimension of the bonding pads such as pads 381-383 and the connection pads such as pad 393. The width of the ridge is preferably between 0.5 μm and 20 μm. This ring can be constructed by joining the bonding pads in the regular array at the locations of the ring by depositing additional copper between the relevant pads. The ratio of the pad widths at the location of the ring to the widths within the chip area can be adjusted in this size range to assure that the rate of erosion of the copper during polishing is sufficiently close to that in the interior of each chip to provide a satisfactory seal without interfering with the bonding of the pads in the interior region.

It should be noted that the ring could be formed from bonding pads or connection pads. If the ring is formed from connection pads, the ring pads are preferably connected to ground or a power rail. The portion of the chip inside the sealing rings will be referred to as the chip circuit area in the following discussion.

As noted above, the preferred distribution for the pads is a regular array of identical pads. From a polishing point of view, the preferred array would be a hexagonal array of hexagonally shaped pads, as this configuration provides a constant distance between the edge of each pad and the edge of each adjoining pad. In addition, the array provides six directions of motion for the polishing disk in which the copper pattern appears identical, and hence, will have the same erosion pattern. As noted above, a hexagon pad is difficult to implement in many fabrication systems. In such systems, an octagon shaped pad on a hexagonal array is preferred if polishing considerations are the most important. In this regard, it should be noted that an octagon pad is also a good approximation to a circular pad.

While a regular array of pads is preferred, other arrays that satisfy the constant metal density rule can also be utilized. For example, an array of randomly placed pads can be constructed such that the metal density within each critically sized area is constant to within the required tolerance.

The drawings and description of the above-described embodiments of the present invention have shown only a portion of a stacked wafer structure having a single metal-filled via for making the vertical connections between the layers and a number of bonding pads. However, it is to be understood that the number of such connection and bonding pads is very large, typically thousands or tens of thousands of vias will be present in each chip; hence, an entire wafer may have millions of such vertical connections. As noted above, these vias also determine the thickness of each component element by providing a polishing stop. Hence, the density of such vias on the wafer must be sufficient to assure that the resulting component element is flat and smooth to within the desired tolerance prior to constructing any bonding pads. In the preferred embodiment of the present invention, the distance between the vias is less than 50 μm. If the density of vias created for vertical connections through the layers is not sufficient, additional vias may be added and used for power rails or ground connections.

The above-described embodiments of the present invention have utilized silicon wafers for all of the component layers that are stacked. However, other material systems can be utilized without departing from the teachings of the present invention. For example, one or more of the component elements can be fabricated from a wafer that has Group III-V material system integrated circuits. Such material systems are particularly useful in fabricating light emitting and detecting devices. The present invention provides a mechanism for combining such optical circuit elements with CMOS circuit elements on a second wafer to provide the benefits of both technologies in a single integrated circuit chip.

As noted above, large bonding pads also fail because the copper-glass bond fails or because the glass fractures in the vicinity of the copper pad. Copper has a substantially higher coefficient of thermal expansion than that of $SiO_2$. By utilizing a large number of small pads in place of one large pad, the problems caused by this difference in coefficient of thermal expansion are significantly reduced. For example, in one embodiment, the copper pads are inset by 1 μm into the $SiO_2$ surface. The surface area around the walls of the well represents a significant fraction of the overall copper-glass bonding area. For example, if a 100 μm×100 μm pad that is inset 1 μm into the $SiO_2$ is replaced by 100 10 μm×10 μm pads with the same inset, the copper-glass bonding surface is increased by approximately 40 percent. In addition, the thermal stresses applied at the boundary of the large pad are substantially higher than those applied at the boundaries of each of the small pads.

The above-described embodiments of the present invention have utilized metal bonding pads. While the connection pads need to be constructed from a conducting material, the bonding pads are not so constrained. For example, the bonding pads can be constructed from an organic material such as photoresist.

The above-described embodiments of the present invention utilize a circuit layer that is covered with an SiO2 dielectric layer. However, other dielectric materials can be utilized. For example, dielectric layers of SiOF or any low-K dielectric can also be utilized.

Various modifications to the present invention will become apparent to those skilled in the art from the foregoing description and accompanying drawings. Accordingly, the present invention is to be limited solely by the scope of the following claims.

What is claimed is:

1. An integrated circuit substrate comprising a circuit layer covered by a dielectric layer having a top surface and a bottom surface;
a plurality of metallic pads comprising a bonding layer that extends into said dielectric layer, said pads extending a first distance above said top surface, at least one of said pads being connected electrically to said circuit layer;
wherein said substrate is divided into a plurality of chip circuit areas and wherein within each chip circuit area, each sub-area greater than 500 μm within said chip circuit area being characterized by metal surface density equal to the fraction of that sub-area that is covered by metal, wherein said metal surface density for each one of said sub-areas is constant to within ±10 percent, and wherein said pads have a maximum dimension greater than 0.5 μm and less than 20 μm.

2. The integrated circuit substrate of claim 1 wherein said pads comprise a layer of copper.

3. The integrated circuit substrate of claim 1 wherein said first distance is greater than or equal to 0.05 μm.

4. The integrated circuit substrate of claim 1 wherein said bonding layer comprises a layer of material chosen from the group consisting of Ta, TaN, W, WN, $Ta_xSi_yN_z$, W2, and $Si_yN_z$.

5. The integrated circuit substrate of claim 1 wherein said pads are arranged in a regular array within each chip circuit area.

6. The integrated circuit substrate of claim 5 wherein said regular array comprises a hexagonal array.

7. The integrated circuit substrate of claim 1 wherein said dielectric layer comprises $SiO_2$, SiOF, or Low-K dielectrics.

8. The integrated circuit substrate of claim 1 wherein said pads have circular cross-sections.

9. The integrated circuit substrate of claim 1 wherein said pads have regular polygonal cross-sections.

10. The integrated circuit substrate of claim 9 wherein said regular polygonal pads have eight or fewer sides.

11. The integrated circuit substrate of claim 1 wherein each of said chip circuit areas further comprises a sealing ring that encloses said chip circuit area, said sealing ring extending above said top surface by said first distance.

12. The integrated circuit substrate of claim 11 wherein said sealing ring has a width less than or equal to 20 μm.

13. An integrated circuit structure comprising:
a first substrate comprising a plurality of first substrate metallic bonding pads on a bonding surface of said first substrate, said first substrate including a first integrated circuit layer having integrated circuit elements; and
a second substrate comprising a plurality of second substrate metallic bonding pads on a bonding surface of said second substrate, said second substrate including a second integrated circuit layer, each second substrate bonding pad being in contact with a corresponding one of said first substrate bonding pads,
wherein said bonding pads on said first substrate comprise a bonding layer that extends into said bonding surface, said pads extending a first distance above said bonding surface, and
wherein each of said first and second substrates is divided into a plurality of chip circuit areas and wherein within each chip circuit area, each sub-area greater than 500 μm within said chip circuit area being characterized by metal surface density equal to the fraction of that sub-area that is covered by metal, wherein said metal surface density for each one of said sub-areas is constant to within ±10 percent, and wherein said pads have a maximum dimension greater than 0.5 μm and less than 20 μm.

14. The integrated circuit structure of claim 13 wherein at least one of said bonding pads in each chip circuit area on each of said first and second substrates is connected to an integrated circuit device within said first and second substrates, respectively.

15. The integrated circuit structure of claim 13 wherein said first distance is greater than or equal to 0.05 μm above said bonding surface.

16. The integrated circuit structure of claim 13 wherein said bonding pads on said first substrate comprise a layer of material chosen from the group consisting of Ta, TaN, W, WN, $Ta_xSi_yN_z$, W2, and $Si_yN_z$.

17. The integrated circuit structure of claim 13 wherein said bonding pads on said first substrate are arranged in a regular array within each chip circuit area.

* * * * *

UNITED STATES PATENT AND TRADEMARK OFFICE
CERTIFICATE OF CORRECTION

PATENT NO. : 7,750,488 B2
APPLICATION NO. : 11/484544
DATED : July 6, 2010
INVENTOR(S) : Patti et al.

It is certified that error appears in the above-identified patent and that said Letters Patent is hereby corrected as shown below:

Column 10, Line 3: replace "is done is a" by --is done in a--.

Column 10, Line 63: replace "acts a" by --acts [as] a--.

Column 11, Line 1: replace "$Ta_xSi_yN$" by --$Ta_xSi_yN_z$--.

Column 11, Line 1: replace "$W_2Si_yN$" by --$W_2Si_yN_z$--.

Column 13, Line 54: replace "SiO2" by --$SiO_2$--.

Signed and Sealed this

Tenth Day of August, 2010

David J. Kappos
*Director of the United States Patent and Trademark Office*